United States Patent [19]
Slade

[11] Patent Number: 6,002,256
[45] Date of Patent: Dec. 14, 1999

[54] RF MAGNETIC FIELD PULSE GENERATOR

[75] Inventor: Robert Andrew Slade, Oxon, United Kingdom

[73] Assignee: Oxford Instruments (UK) Ltd., Oxford, United Kingdom

[21] Appl. No.: 08/860,234

[22] PCT Filed: Oct. 3, 1996

[86] PCT No.: PCT/GB96/02427

§ 371 Date: Jun. 3, 1997

§ 102(e) Date: Jun. 3, 1997

[87] PCT Pub. No.: WO97/13159

PCT Pub. Date: Apr. 10, 1997

[30] Foreign Application Priority Data

Oct. 5, 1995 [GB] United Kingdom .................... 9520357

[51] Int. Cl.[6] ........................................................ G01V 3/02
[52] U.S. Cl. ............................ 324/322; 324/318; 324/320
[58] Field of Search ..................... 324/300–319, 324/320–322; 315/501; 128/653; 323/282

[56] References Cited

U.S. PATENT DOCUMENTS

| | | | |
|---|---|---|---|
| 4,628,264 | 12/1986 | Rzedzian | 324/322 |
| 4,709,317 | 11/1987 | Iizuka et al. | 363/37 |
| 4,820,986 | 4/1989 | Mansfield et al. | 324/322 |
| 5,235,281 | 8/1993 | Haragashira et al. | 324/318 |
| 5,298,863 | 3/1994 | Nowak et al. | 324/318 |
| 5,592,083 | 1/1997 | Magnuson et al. | 324/300 |
| 5,629,624 | 5/1997 | Carlson et al. | 324/309 |

FOREIGN PATENT DOCUMENTS 0 357 141  3/1990  European Pat. Off. .

OTHER PUBLICATIONS

M. Sauzade, et al., IEEE/8th Annual Conference of Engineering in Medicine and Biology Society, *Simulation and Test of a Slice Profile for N.M.R. Imaging System*, vol. 2, (no month) 1986, pp. 1139–1141.

P. Broekaert, J. Jeener, Journal of Magnetic Resonance Series A, *Suppression of Radiation Damping in NMR in Liquids by Active Electronic Feedback*, vol. 113, (no month), 1995, pp. 60–64.

*Primary Examiner*—Josie Ballato
*Assistant Examiner*—Tiffany A. Fetzner

[57] ABSTRACT

An rf magnetic field pulse generator for generating an rf magnetic field pulse for use in an NMR investigation. The generator includes two arms connected in parallel between a pair of input terminals, each arm having two serially connected solid-state switches, a transmitter coil connected between output terminals defined between each pair of serially connected solid-state switches respectively, the transmitter coil being adapted to transmit the magnetic field pulse in response to an alternating rf signal at the output terminals, a power source connected to one or both input terminals, and a controller adapted to alternatively operate a respective switch in each arm at a required radio frequency in use whereby the power source is connected with alternating polarity across the transmitter coil and generates an alternating rf signal at the output terminals.

12 Claims, 12 Drawing Sheets

GATE DRIVE (O/P OF PULSE TRANSFORMER)

NOTE RAPID PULSE TERMINATION FOLLOWED BY HIGH FREQUENCY RINGING "TAIL"

NOTE REMOVAL OF HIGH FREQUENCY "TAIL"

RF MAGNETIC FIELD PULSE GENERATOR

BACKGROUND

1. Field of the Invention

The present invention relates to a magnetic field pulse generator, in particular for generating an rf pulse for use in a nuclear magnetic resonance (NMR) investigation. The invention is particularly concerned with providing such a generator for use in a down-hole oil well logging application.

2. Description of the Related Art

Conventional NMR pulse signal amplifiers employ linear class A/B amplifiers (typically valve amplifiers).

SUMMARY OF THE INVENTION

In accordance with the present invention there is provided an rf magnetic field pulse generator for generating an rf magnetic field pulse for use in an NMR investigation, the generator comprising;

1) two arms connected in parallel between a pair of input terminals, each arm comprising two serially connected solid-state switches;
2) a transmitter coil connected between output terminals defined between each pair of serially connected solid-state switches respectively, the transmitter coil being adapted to transmit the magnetic field pulse in response to an alternating rf signal at the output terminals;
3) a power source connected to one or both input terminals; and,
4) control means adapted to alternately operate a respective switch in each arm at a required radio frequency in use whereby the power source is connected with alternating polarity across the transmitter coil and generates an alternating rf signal at the output terminals.

The configuration of switches according to the present invention is known as an "H-bridge". Preferably the solid-state switches comprise class D/E amplifiers. It has been found that this configuration is suitable for use in an NMR investigation (especially a down-hole well logging device) since it is reliable (low voltage stress on the solid-state switches), and a minimum number of capacitors are necessary (capacitors are difficult to manufacture and can be unreliable at operating temperatures of the order of 150° C.).

The design provides greater efficiency (i.e. low power loss in the amplifier components) than the conventional design which employs class A/B amplifiers. It also provides greater simplicity (few components), smaller size and higher robustness and reliability (due in part to the use of solid-state devices).

Preferably, the solid-state switches are MOSFET switching power transistors, such as HEXFETs. These have been found to be suitable for the power and switching requirements of a down-hole NMR application. In addition the MOSFETs are able to withstand operating temperatures of the order of 150° C. albeit at reduced current rating.

The switches may each comprise a single solid-state switch, or may each comprise a number of solid-state switches in parallel.

Preferably, the control means comprises a circuit adapted to generate two control signals which are 180° out of phase with each other and drive the gates of diagonal pairs of switches in the H-bridge. Preferably, the control circuit comprises another H-bridge, controlled by an rf signal generator.

Preferably, the transmitter coil is part of a resonant circuit comprising a capacitance (typically a capacitor) connected in parallel or series with the coil.

Preferably, the resonant circuit comprises a capacitor connected serially with the transmitter coil. The use of a series tuned circuit which has a low impedance at resonance, (rather than a parallel tuned circuit which has a high impedance at resonance) ensures that all nodes in the circuit remain at or below the local supply voltage (typically 250 Vdc), except the connection between the transmitter coil ($L_T$) and the capacitance ($C_T$), which may exceed 5 kV depending on the tuned circuit quality factor, Q ($=\omega L_T/R_T$). Preferably, this is a permanent connection and the capacitance is located in an oil filled centre section, with the transmitter coil. If it is necessary to tune the resonant circuit in service, due to $B_0$ drift and/or drift in $C_T$ or $L_T$, extra tuning capacitors can be switched in between pulse trains. Preferably the capacitor switches are highly specified high voltage and high current relays.

Alternatively, the transmitter may not form part of a resonant circuit. In this case, driving the coil directly without a tuning capacitor will only work if its characteristic time constant is much smaller than the period of the drive frequency. At the resonant frequency, the impedance of a series tuned circuit reduces to the value of the resistive losses ($R_T$), and the reactive components ($\omega L_T$ and $\omega C_T$) disappear. If the tuning capacitor is omitted, the coil's inductive reactance ($\omega L_T$) dominates the impedance seen by the transmitter. The ratio of resistance to reactance ($R_T/\omega L_T$) defines the coil's characteristic time constant ($\tau$, which is the reciprocal of Q, the quality factor). If this is small compared to the on-time (i.e.: half the switching period) the current will rise to its maximum value, limited by $R_T$, during the on half-cycle and the system will work, albeit with poor spectral purity and wasted power, due to the harmonics introduced by the resulting "square"-shaped current pulses. If $\tau$ is large compared to the on-time, then the current will not rise to the required on-value before the driving voltage is reversed.

Typically ring-down in the resonant circuit is minimised by adding an active ring-down circuit comprising one or more damping resistances connected via one or more switches to the resonant circuit, and control means adapted to close the switch(es) after a magnetic pulse. As a result, the damping resistance(s) form part of a current loop including the resonant circuit and dissipate energy so as to control ring-down in the resonant circuit.

The ring-down circuit may comprise a single resistor, but preferably comprises two resistors each with a respective switch. Preferably, the switches are solid-state switches such as MOSFETs.

Preferably, the power source comprises one or more power storage capacitors. In a down-hole well logging application the capacitor(s) are preferably located with the probe in the well and are connected to a DC power source on the surface.

In accordance with a second aspect of the present invention there is provided a method of operating a generator according to the first aspect of the invention the method comprising operating respective ones of each pair of switches during a pulse and at the end of the pulse opening all four switches whereby ring-down in the resonant circuit is controlled.

The second aspect of the invention provides an additional method of controlling ring-down in the resonant circuit after a pulse. Preferably, after the switches have been opened for a predetermined time, the active ring-down circuit if provided is switched in to control low voltage ringing.

BRIEF DESCRIPTION OF THE DRAWINGS

A number of embodiments of the present invention will now be described with reference to the accompanying Figures, in which:

FIG. 6 is a graph illustrating the current through the transmitter coil $L_T$ with the switches opened at the end of the pulse, but without the active damping circuit switched in;

FIG. 8 illustrates the voltage across the transmitter coil with the four switches opened at the end of the pulse and the active damping circuit switched in;

DESCRIPTION OF THE PREFERRED EMBODIMENTS

Figure 1:
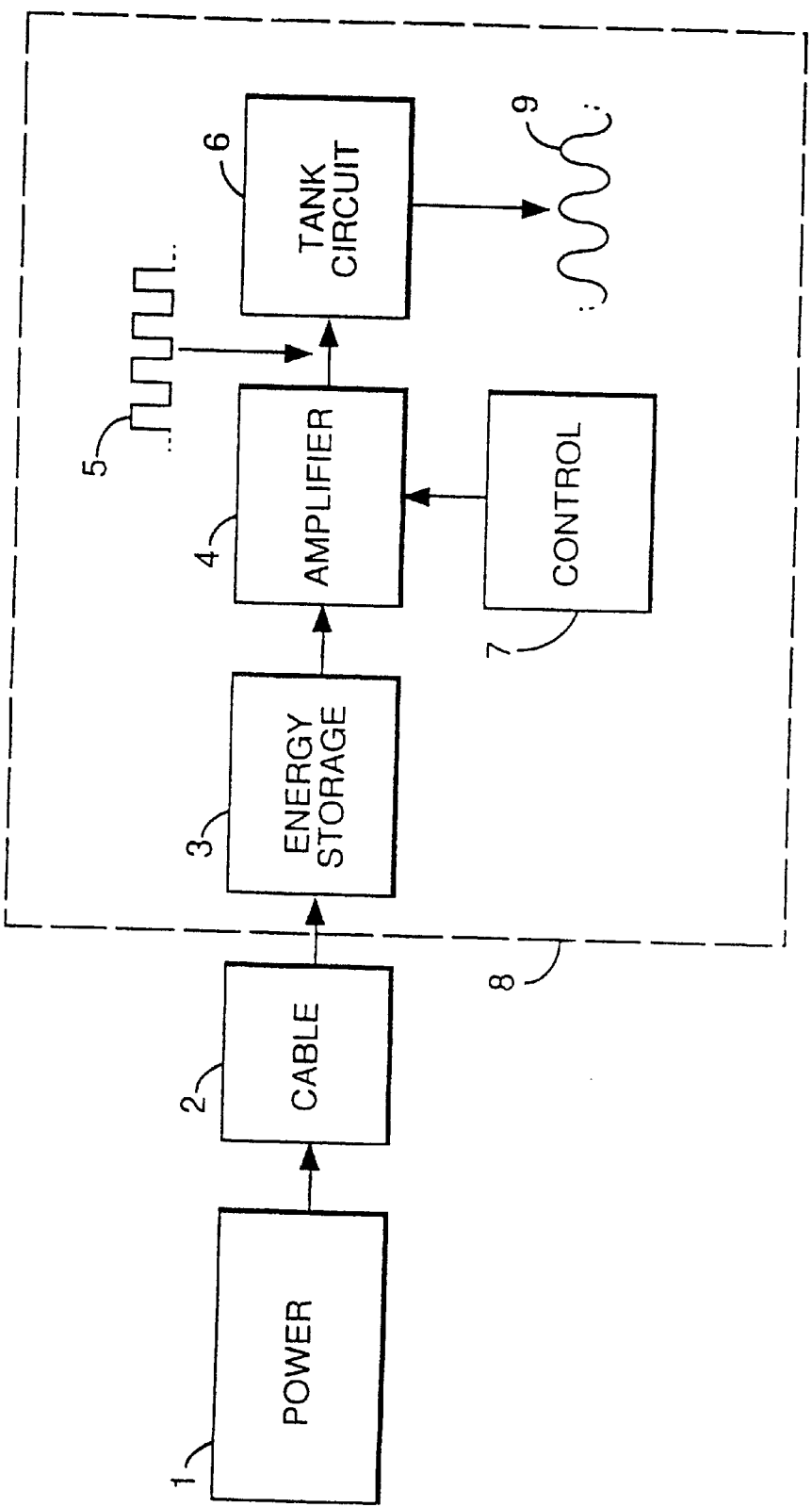
FIG. 1 is a schematic diagram of a pulse generator according to the invention.

With reference to FIG. 1, the pulse generator includes a surface DC power supply 1 connected via a cable 2 (which passes along the length of a well hole) to a probe 8 incorporating an energy storage device 3. The energy storage device 3 is connected to an amplifier 4 which provides a pulsed AC rf signal 5 to tank circuit 6 under control of control circuit 7. The tank circuit 6 transmits an rf magnetic signal 9 which is used in an NMR investigation of the environment surrounding the probe 8.

Figure 2:
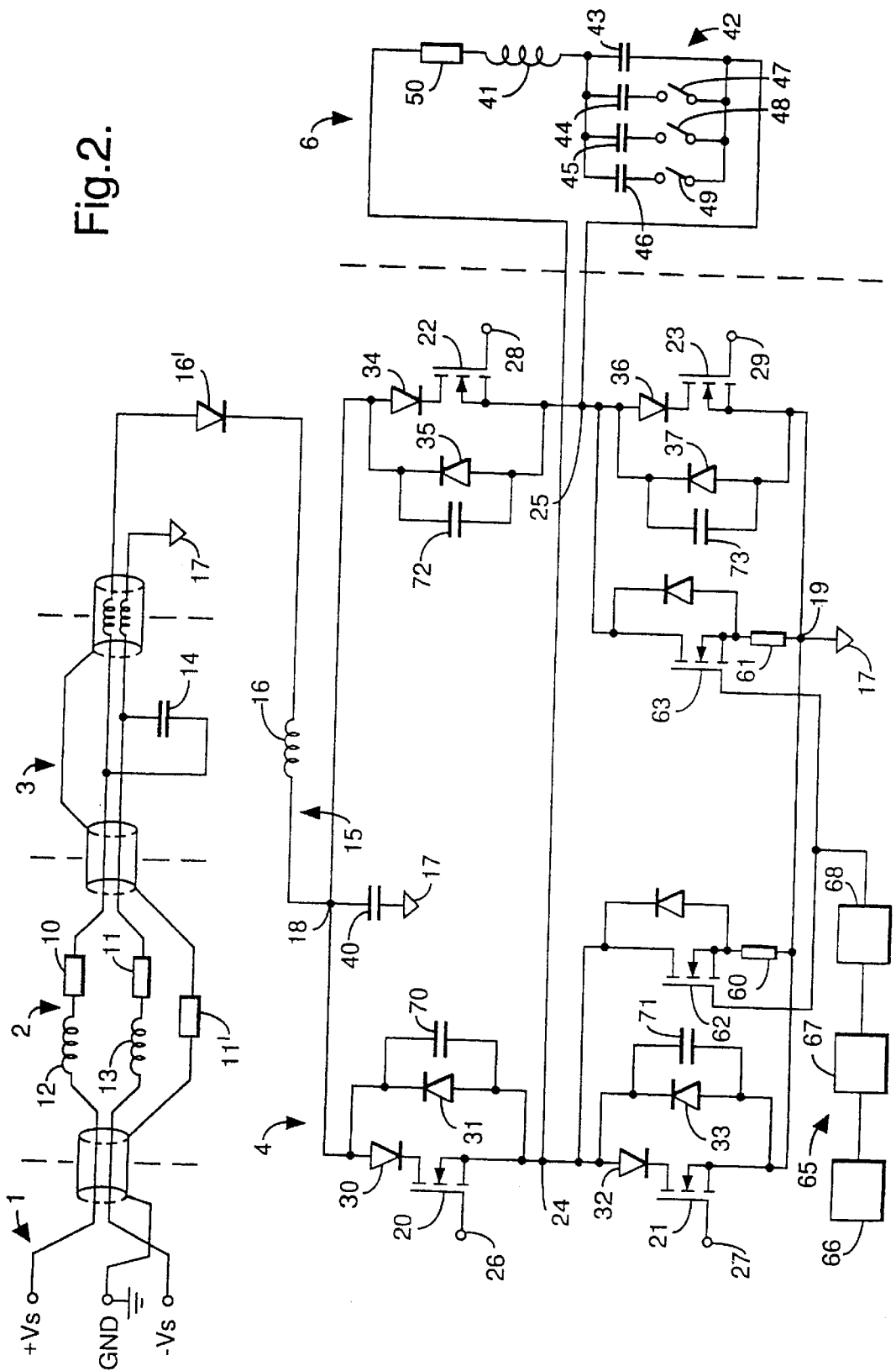
FIG. 2 is a schematic diagram illustrating the components of FIG. 1 in further detail.

FIG. 2 illustrates the generator in more detail. Surface power supply 1 provides DC power voltages $+V_S$ and $-V_S$ to energy storage capacitor 14 via cable 2. Typically $V_S$ ranges between 250 and 500 V (i.e. a voltage difference of 500–1000 V), at a power of 500 W. The voltage is dictated in part by the design of the power storage capacitor 14 and the voltage capability of the MOSFETs. As illustrated, the cable 2 has an associated cable resistance and inductance, illustrated by resistors 10, 11, 11' and inductances 12, 13. The cable 2 comprises two quasi-balanced cables. An absolute minimum of 250 J of stored energy is required to be stored in capacitor 14. Capacitor 14 is schematically illustrated as a single capacitor but is typically embodied by a bank of parallel capacitors to give the large capacitance required. A modular construction is adopted for the energy storage module 3, each unit comprising a capacitor 14 which can store 250 J such that extra modules can be attached to the generator and the total stored energy tailored to suit the pulse sequences used, and to suit the well logging tool environment.

The energy storage device 3 is required since the mean power available from the surface is limited to 500 watts, which is exceeded by the required peak pulse power of about 10 kW. The capacitor 14 is sized to store sufficient energy to meet the twin constraints of the longest pulse spin-echo sequence and the longest acceptable inter-sequence re-charge time. The second constraint normally means that the stored energy is two to five times that required to satisfy the first constraint. With the required energy of 250 J and the voltage range of 500–1000 volts DC the required capacitance is therefore in the range 500–2000 $\mu F$. The energy storage device 3 is connected to the amplifier 4 via a connector 15 with an associated connector inductance 16 and a stopping diode 16' and to the amplifier's local ground reference 17. The transmitter amplifier's local ground reference 17 may be floating several hundred volts negative with respect to surface ground.

The amplifier 4 is configured as an H-bridge resonant converter comprising four HEXFET modules (International Rectifier "HEXFETs") 20–23. The HEXFETS modules 20–23 may be models IRFK6H450, IRFK6H350 or similar. Alternatively the HEXFET modules may be replaced with many paralleled smaller devices, such as HEXFET III devices. The energy storage connector 15 is connected to an H-bridge input terminal 18. The other power input terminal 19 is connected to the amplifier ground 17. The tank circuit 6 is connected between output terminals 24,25 (i.e. the tank circuit 6 is connected across the central bar of the "H").

The HEXFET switches 20–23 are driven from a high current driver circuit 7 (not shown in FIG. 2) which is itself an H-bridge of smaller HEXFET devices, via a pulse transformer (producing signals G1 and G2 which are input to the pairs of control gates 27,28 and 26,29 respectively). The driver circuit 7 must have sufficient current slew rate to turn on the FETs 20–23 in less than 100 ns. Diode pairs 30–37 are dual fast recovery diode modules which isolate the FETs' own (slower) diode (not shown) and ensure rapid switch off.

Figure 3A:
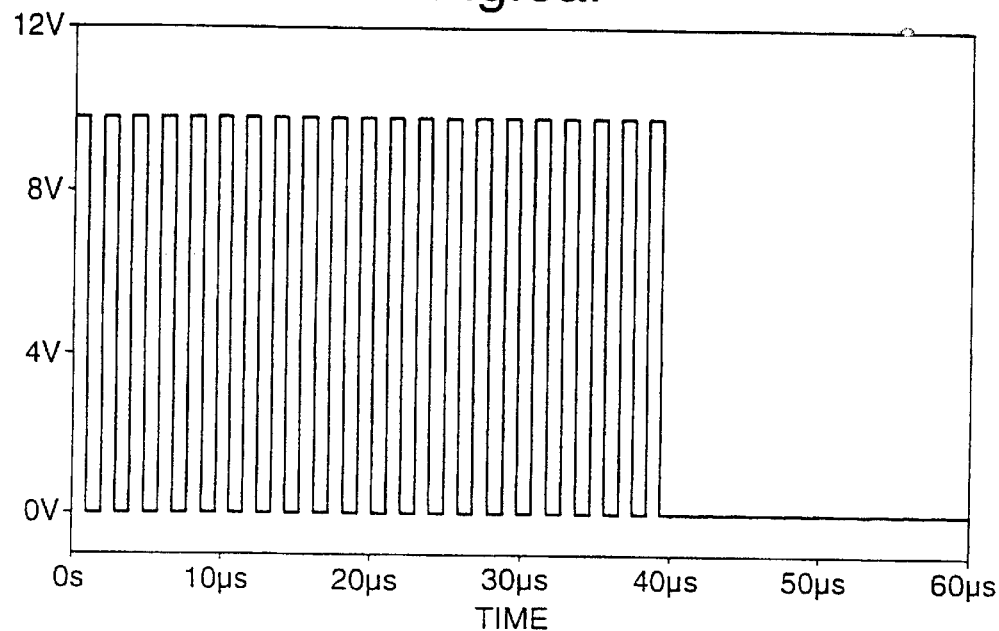
FIGS. 3a and 3b are graphs showing the voltage of gate drive signals G1 and G2 during a pulse.
Figure 3B:
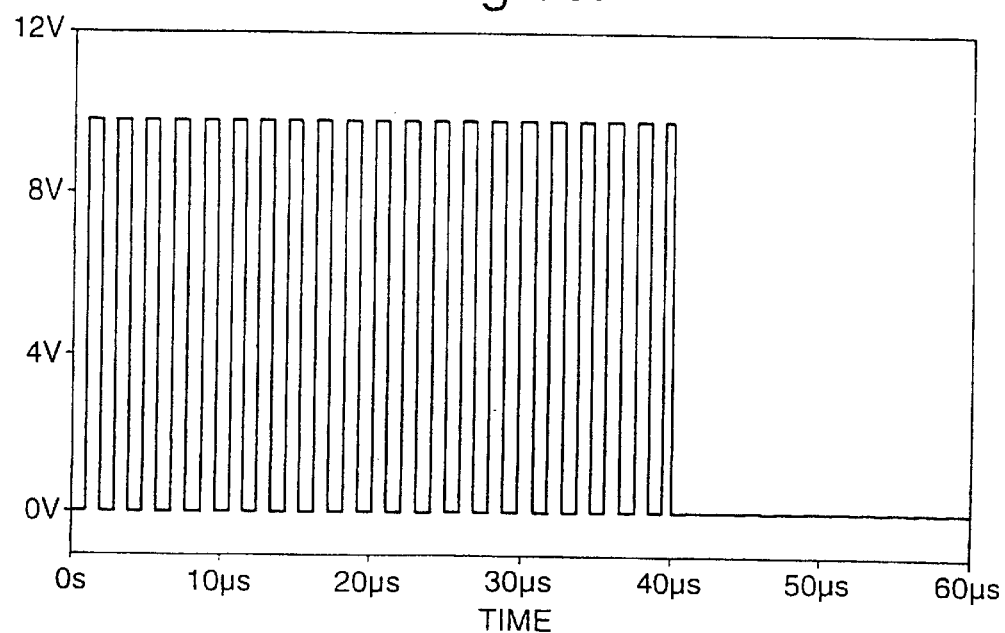

The gate signals G1 and G2 are illustrated in FIGS. 3a and 3b respectively, during a single 40 $\mu s$ pulse. As can be seen, the signals G1 and G2 are 180° out of phase with each other. As a result, the alternate pairs 20,23 driven by G2 and 21,22 driven by G1 are switched on alternately and result in an alternating voltage being presented to the output terminals 24,25.

Whilst the horizontal scale of FIG. 3 is not large enough to illustrate it, the driver circuit 7 ensures that a dead-time exists between the gate signals G1 and G2, to guard against simultaneous switch on of both FETs in a leg (where each pair of switches 20,21 and 22,23 constitutes a "leg" of the H-bridge). A current sensing control circuit is also incorporated (not shown).

The signals to the upper FETs 20,22 have to be floating with respect to circuit ground. The gate pulses are therefore coupled from the gate drive circuit via a pulse transformer.

Bypass capacitor 40 is required to locally "stiffen" the supply line, negating the effects of stray cable inductance from the local storage capacitor.

Figure 4:
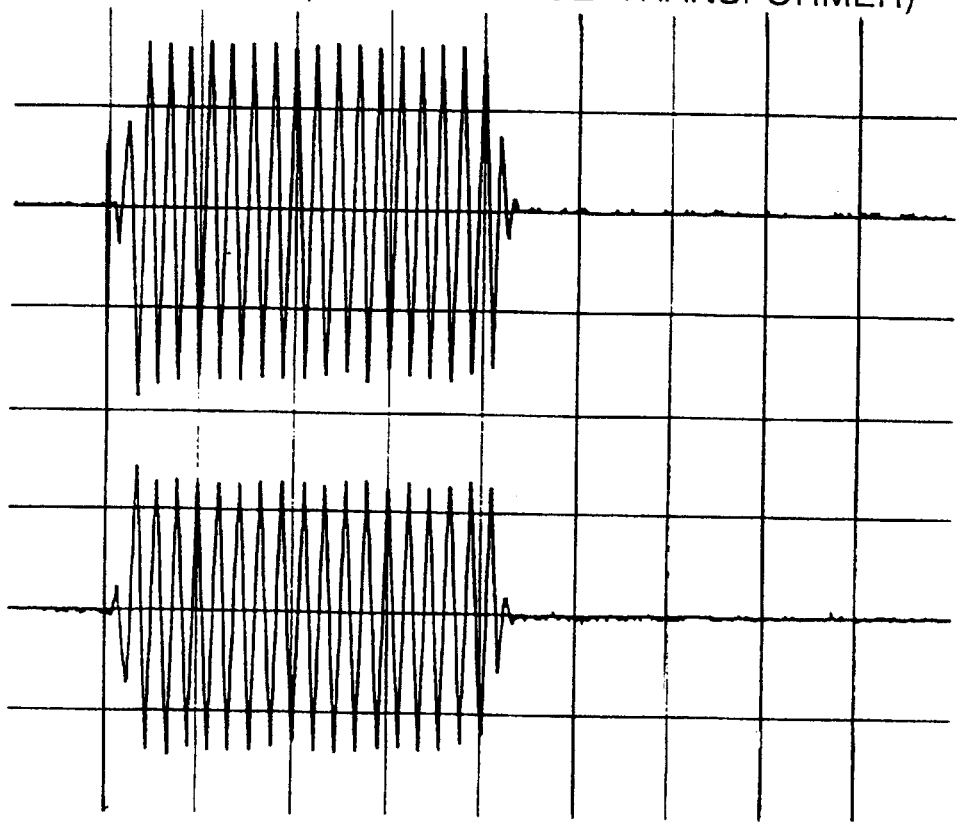
FIG. 4 is a graph showing a real pair of gate drive signals derived from the output of the pulse transformer.

FIG. 4 illustrates the real gate signals derived from the output of the pulse transformer.

Referring back to FIG. 2, resonant tank circuit 6 comprises a transmitter coil 41 tuned in series with a tuning capacitor 42 to the Larmor frequency. The tuning capacitor 42 is configured as a series of parallel capacitors 43–46. During normal operation only the first capacitor 43 is connected. If it is necessary to tune the transmitter circuit in service, due to $B_0$ drift and/or drift in capacitor 43 or coil 41 the extra tuning capacitors 44–46 can be switched in between pulse trains. The associated switches 47–49 are highly specified high voltage and high current relays.

Typical component values are as follows:

Diodes 30–37: BYT261PIV-600: Vrrm=600 V, Ifrm=800 A, dual fast recovery diode pack, ISOTOP package.

Transmitter coil: L-22uH, Peak voltage,10 kV max., peak current,100 A; resistance 50: minimised by careful design, use of Litz wire, etc.

Capacitors 43–46: high voltage, high frequency ceramic disk capacitors with 150° capability. (Typical values: capacitor 43: 5.9 nF, capacitor 44: 180 pF, capacitor 45: 360 pF, capacitor 46: 710 pF for a 10% frequency change from 440 kHz.)

Switches 47–49: isolation to 10 kV, 100 A peak current, minimal DC and AC resistance, known stray inductance and capacitance. (Switching time is not important).

Resistance 50 represents the total loss resistance, comprising DC and AC resistance of coil 41 and capacitors 43–46 and the reflected loss in the conductive surroundings of the probe. The quality factor Q of the H-bridge 4 is determined by the sum of this loss and the loss in the pair of conducting FETs. The efficiency of the transmitter is related to the ratio of the loss in the coil 41 to the loss in the H-bridge 4 and driver circuit during a pulse. The efficiency will degrade with increasing temperature and the FET on-resistance increases. An advantage of the amplifier of the invention is that between pulses it consumes almost no power; this is in contrast with a vacuum tube system which consumes several dozen watts of heater power at all times.

Figure 5:
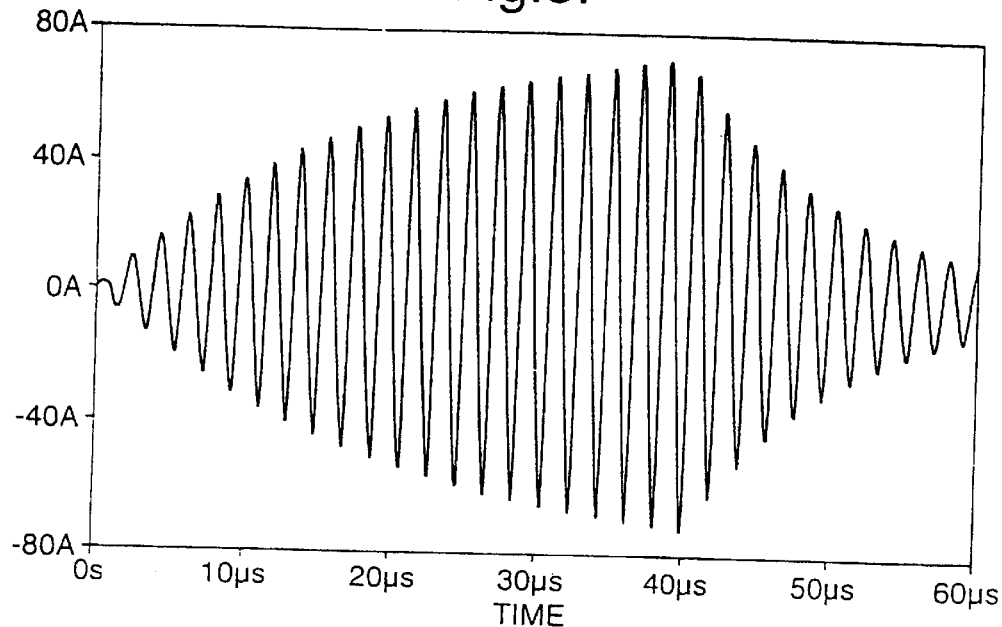
FIG. 5 is a graph showing the current through the transmitter coil during a conventional pulse with no ring-down method according to the second aspect of the invention.

During a typical NMR investigation, a series of pulses of RF energy (the series of pulses being known as a "pulse train") is output by the transmitter coil 41. A single pulse is illustrated in FIG. 5, which is a graph of current through the transmitter coil 41 during a pulse applied to the output terminals 24,25 between 0 and 40 µs, during which active "ring-down" is not employed. That is, at the end of the pulse the two lower switches 21,23 are closed, and the two upper switches 20,22 are open. In addition the ring-down circuit (described below) is not switched in. As can be seen in this conventional pulse, a significant "ring-up" time (approximately between 0 and 40 µs) is experienced. In addition, a significant "ring-down" is illustrated between 40 µs and 60 µs (and continuing on after 60 µs but not shown in FIG. 5). Ring-up and ring-down is an inevitable consequence of the resonant circuit 6. The ring-up and ring-down time is related to the Q factor of the circuit. Whilst a high Q factor is desirable during a pulse to reduce the power loss in the coil, the associated ring-up and ring-down periods are undesirable features of a pulse. The problems of ring-down are controlled in two ways as described below.

Figure 6:
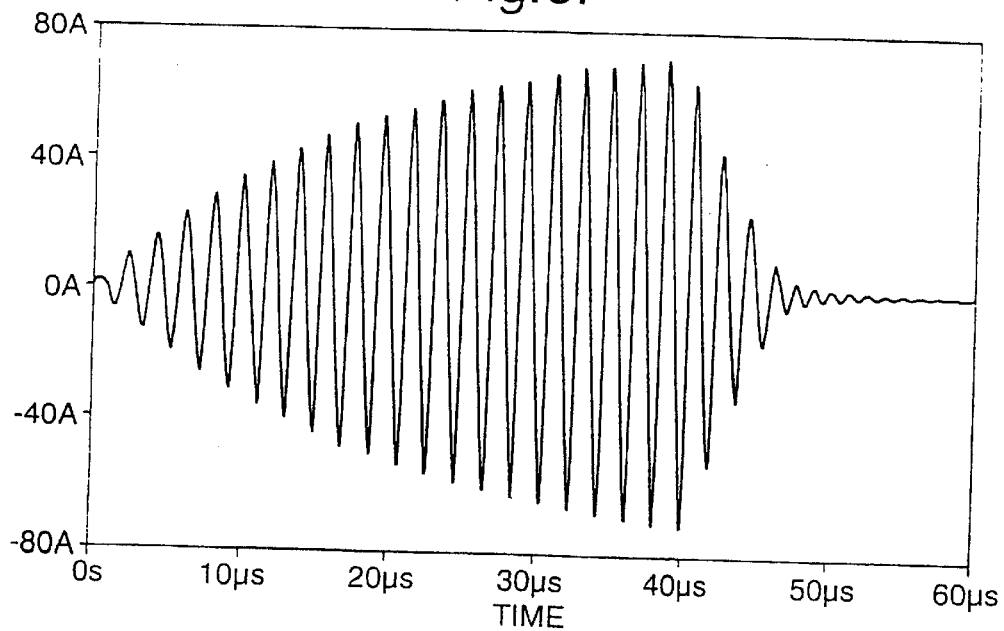
Figure 16:
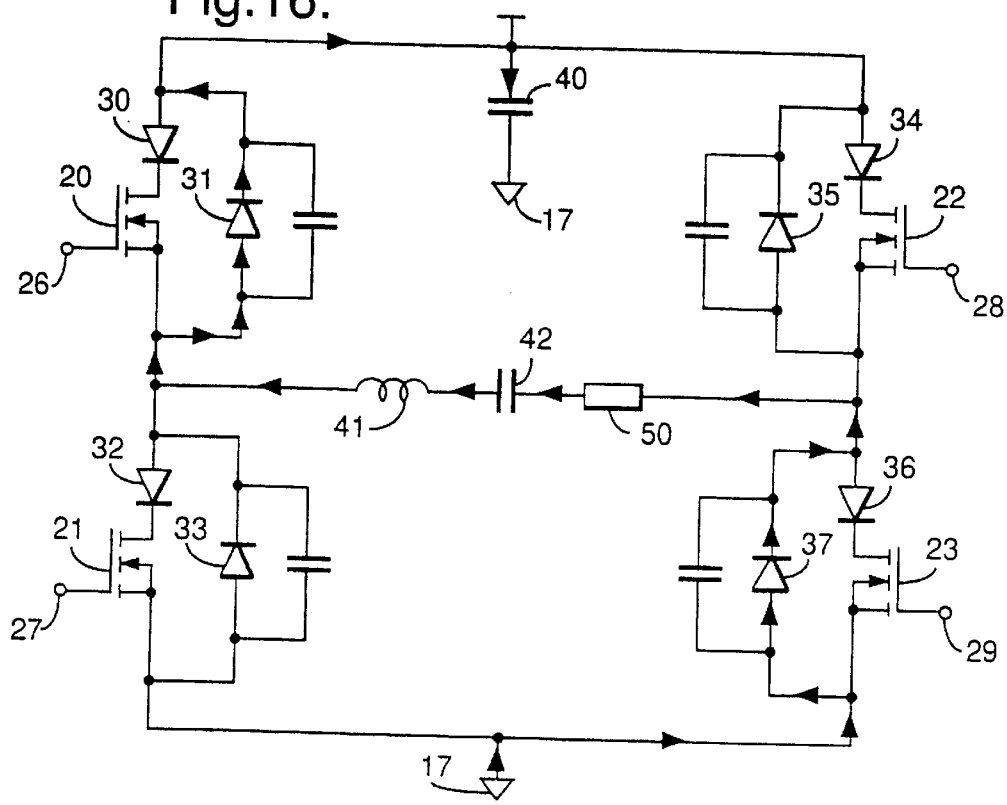
FIG. 16 shows the instantaneous current path during the initial ringdown phase.
Figure 17:
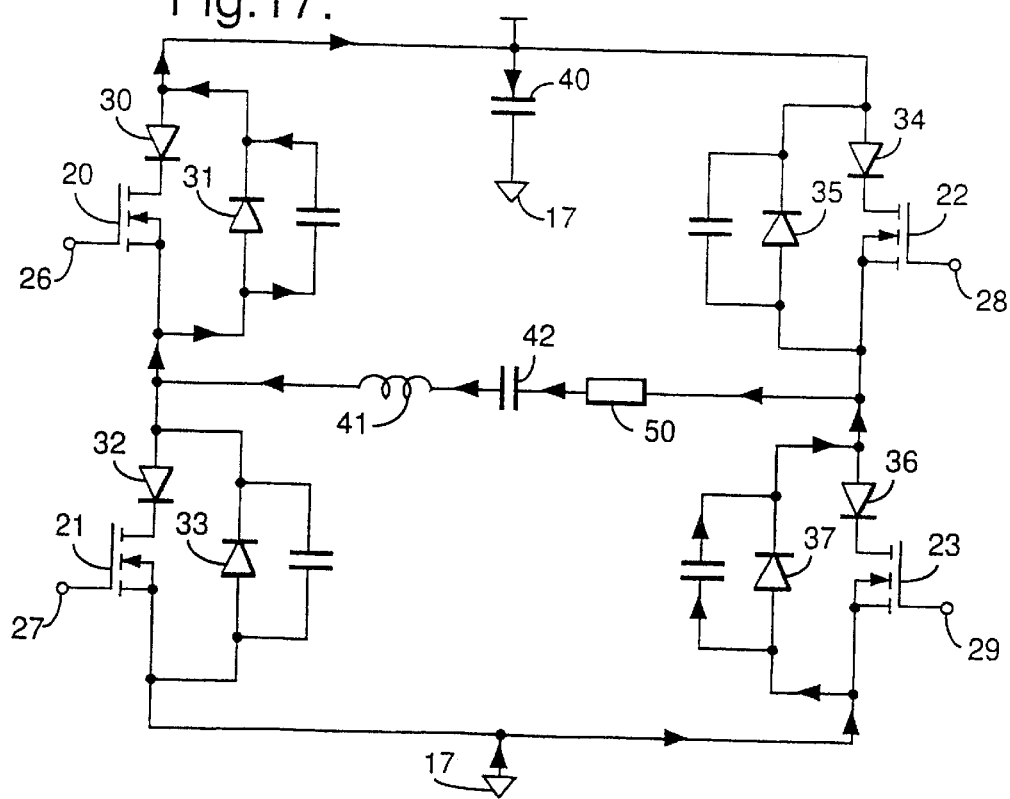
FIG. 17 shows the instantaneous current path during the final ringdown phase, with no active damping.

Firstly, after the pulse is terminated at 40 µS, the switches 20–23 are all opened. In this state the tank circuit energy commutes via the lossy path of FET diodes and bypass capacitor 40, as shown in FIG. 16, and an initially rapid ring-down is achieved, energy being usefully pumped back into bypass capacitor 40 rather than dissipated. Diode 16' is needed to store the energy from the first ring-down stage back into bypass capacitor 40. The resulting pulse shape is shown in FIG. 6. As can be seen, a much more rapid ring-down is achieved between approximately 40 µs and 50 µs. However, this mode of circuit operation ceases when the FET diodes stop conducting. Current then commutes via the FET's stray capacitances 70–73 and bypass capacitor 40, as shown in FIG. 17, increasing the frequency of the ringing, which continues for several tens of microseconds. This is shown approximately after 50 µs in FIG. 6. This remaining current would be sufficient to re-ring the receiver coil, so it is best to introduce a resistive damping loop at this point.

Damping resistors 60 and 61 are connected between the output terminals 24,25 and input terminal 19 via MOSFET switches 62,63.

Operation of switches 62,63 is controlled by a control circuit 65 comprising a control signal 66 which is input via optocoupler 67 and low pass filter 68. Switches 62,63 are thus closed a few micro-seconds after the pulse, completing a current loop through items 41-42-63-61-60-62-50. This active method of Q spoiling does not affect the system's Q during the pulse.

Figure 7:
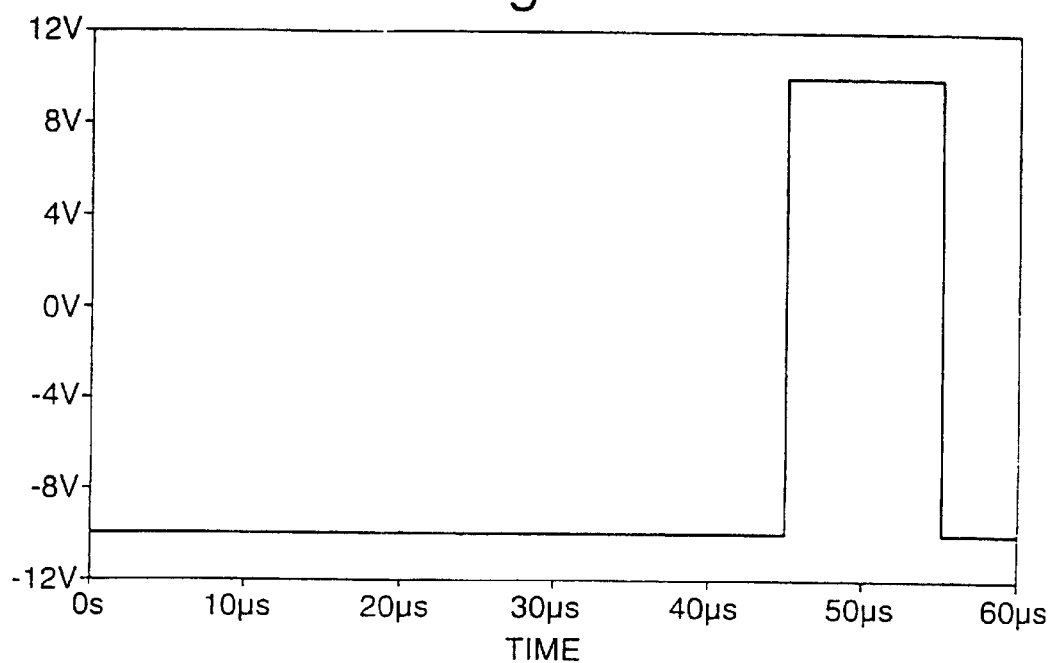
FIG. 7 illustrates the active ring-down control signal applied to the switches Q5 and Q6.

The control signal applied to switches 62,63 is illustrated in FIG. 7. As can be seen, the ring-down circuit is switched in at approximately 45 µS (5 µs after the end of the pulse). At this time the pulse has decayed significantly due to the opening of the four switches 20–23 and is about to enter into the higher frequency ring-down phase between 50 and 80 µs previously illustrated in FIG. 6. The remaining stored energy is lost as heat in resistors 60,61 whose values are chosen to give an optimal (i.e. just under-damped) ring-down time, i.e.

$$\frac{R_T + R_{D1} + R_{D2}}{C_T^2 L_T} = 4$$

where $R_T$ is the resistance 50;

$R_{D1}$ is the resistance of resistor 60;

$R_{D2}$ is the resistance of resistor 61;

$C_T$ is the capacitance of capacitor 42; and $L_T$ is the inductance of coil 41.

Figure 8:
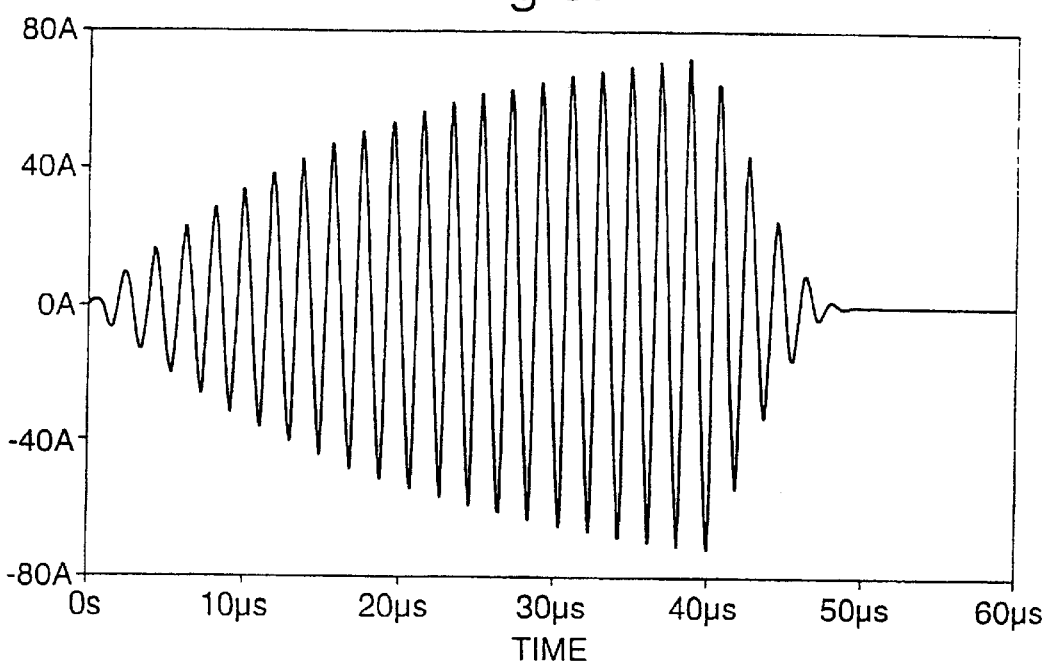
Figure 18:
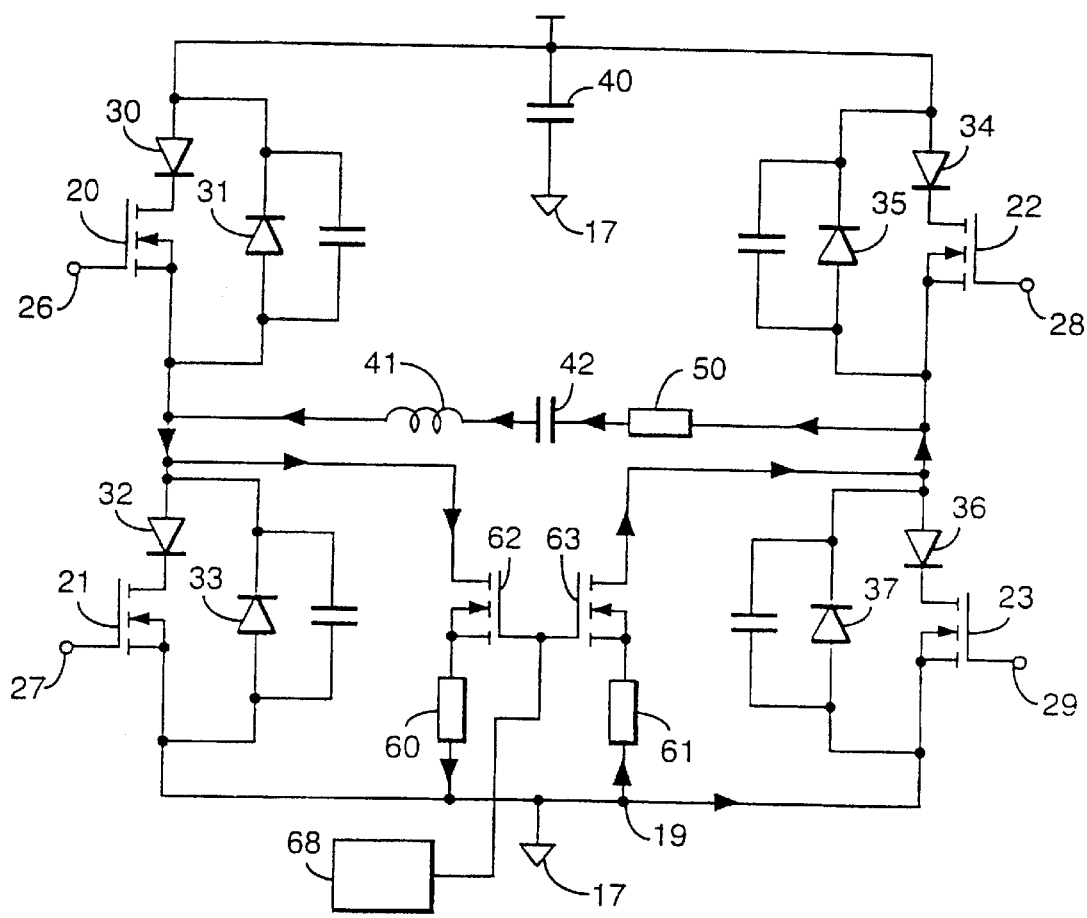
FIG. 18 shows the instantaneous current path during active damping.

The resulting voltage across coil 41 is shown in FIG. 8. As can be seen, rapid ring-down is achieved, and no observable ringing is present after approximately 50 µS. The current path during the actively damped ringdown phase is shown in FIG. 18.

Figure 10:
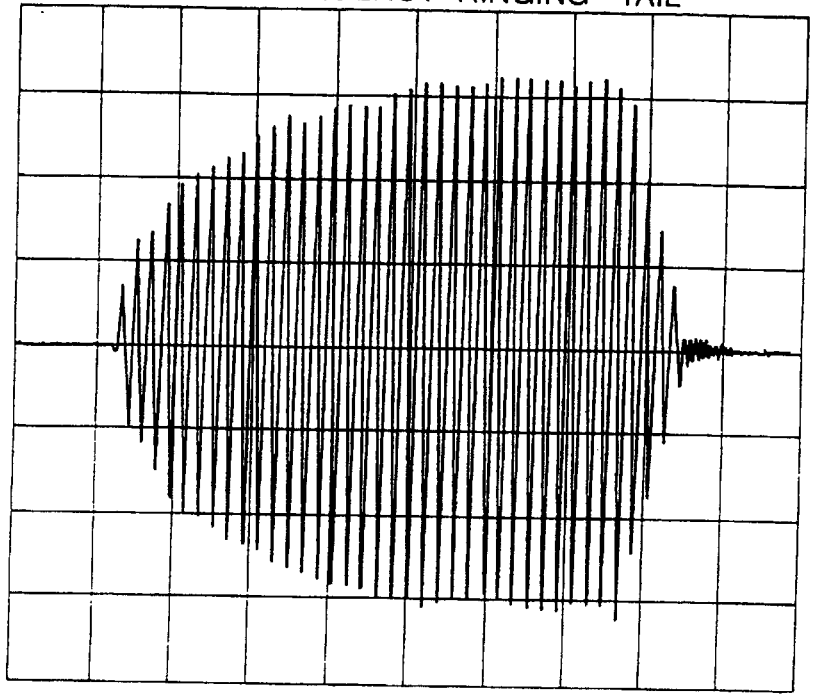
FIG. 10 shows a typical pulse without ring-down circuit.
Figure 11:
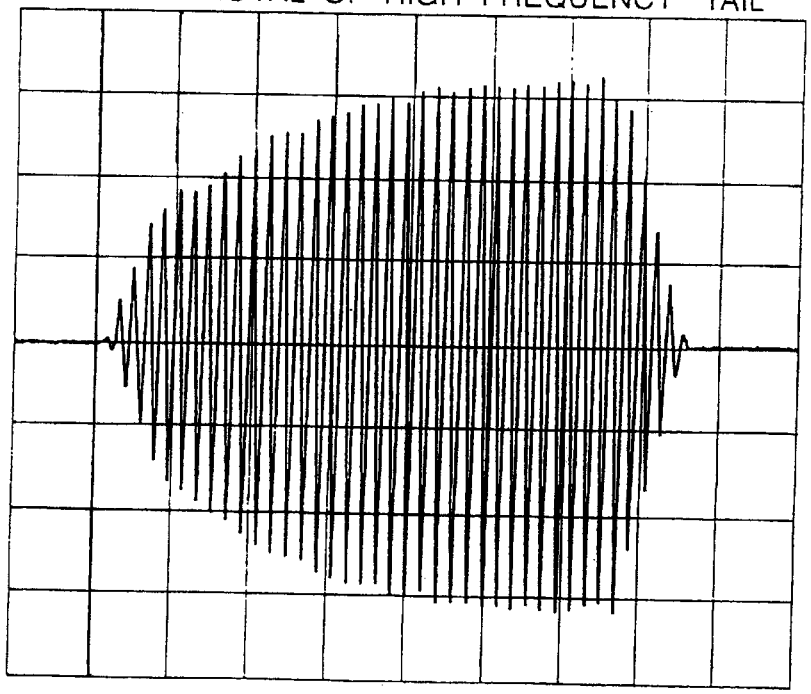
FIG. 11 is as FIG. 10 but with a ring-down circuit.
Figure 12:
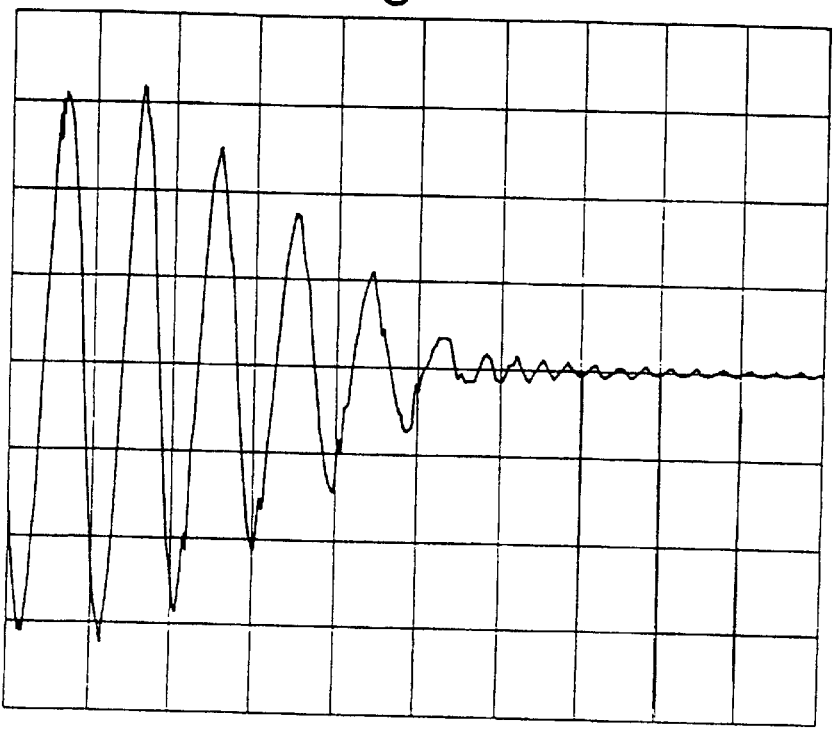
FIG. 12 shows the end of the pulse of FIG. 10 in more detail (no ring-down)
Figure 13:
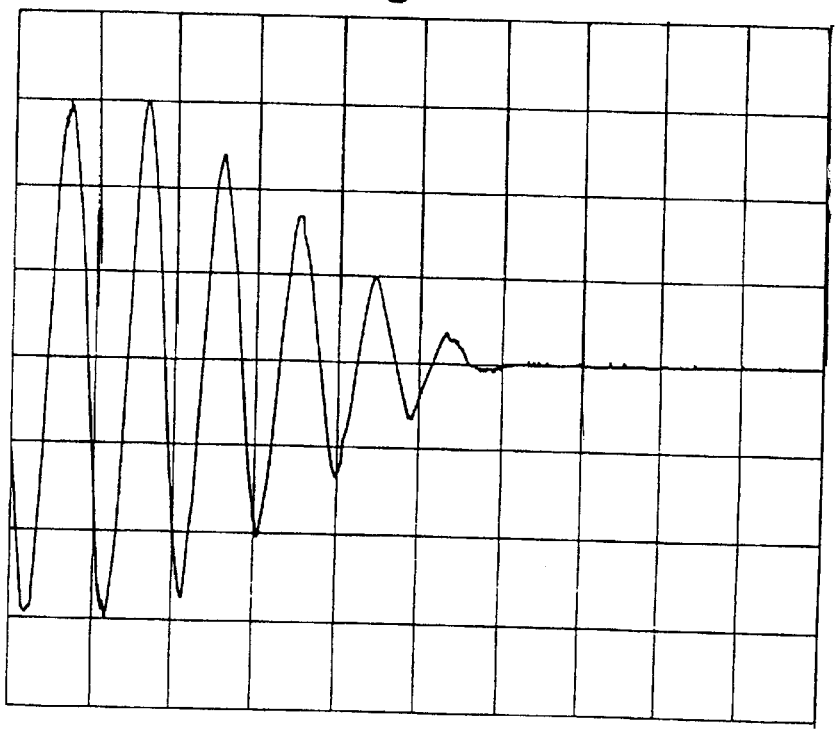
FIG. 13 shows the end of the pulse of FIG. 11 in more detail (with ring-down)
Figure 14:
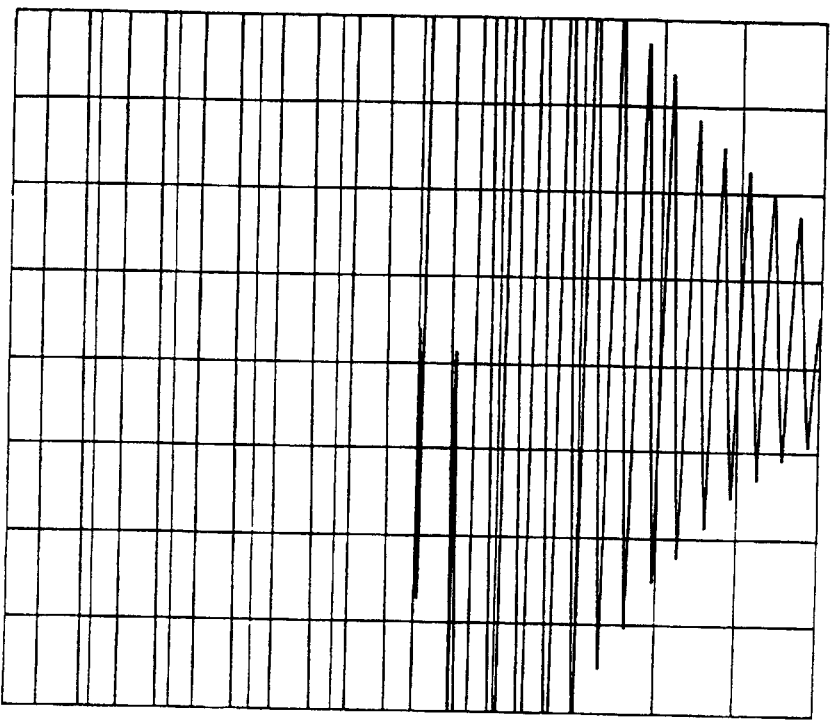
FIG. 14 shows the end of the pulse of FIG. 10 in yet more detail (no ring-down)
Figure 15:
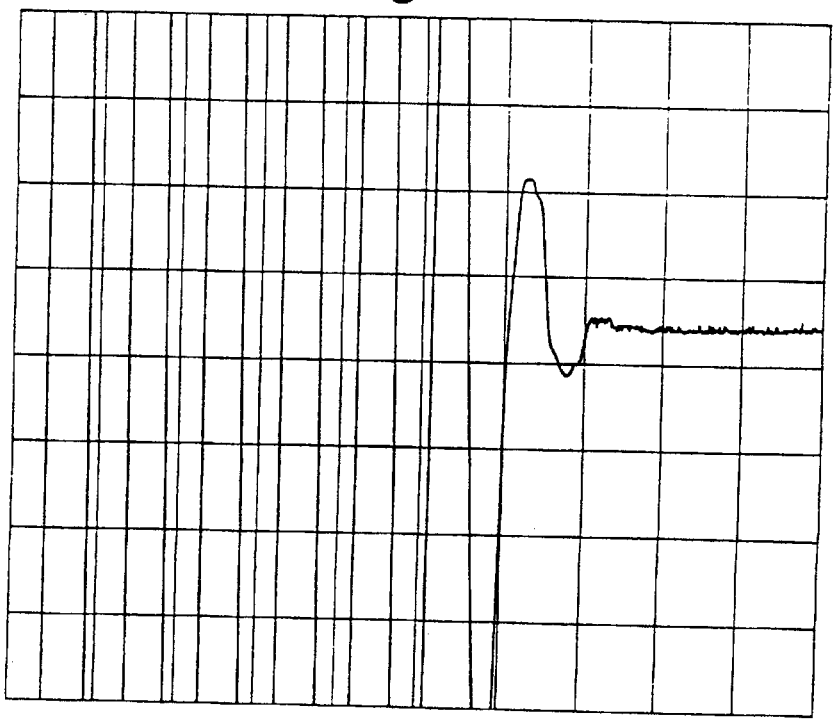
FIG. 15 shows the end of the pulse of FIG. 11 in yet more detail (with ring-down)

FIGS. 11, 13 and 15 are oscilloscope plots of real ring-down operation, contrasted with FIGS. 10, 12 and 14 which show pulses where no active ring-down is employed.

Figure 9:
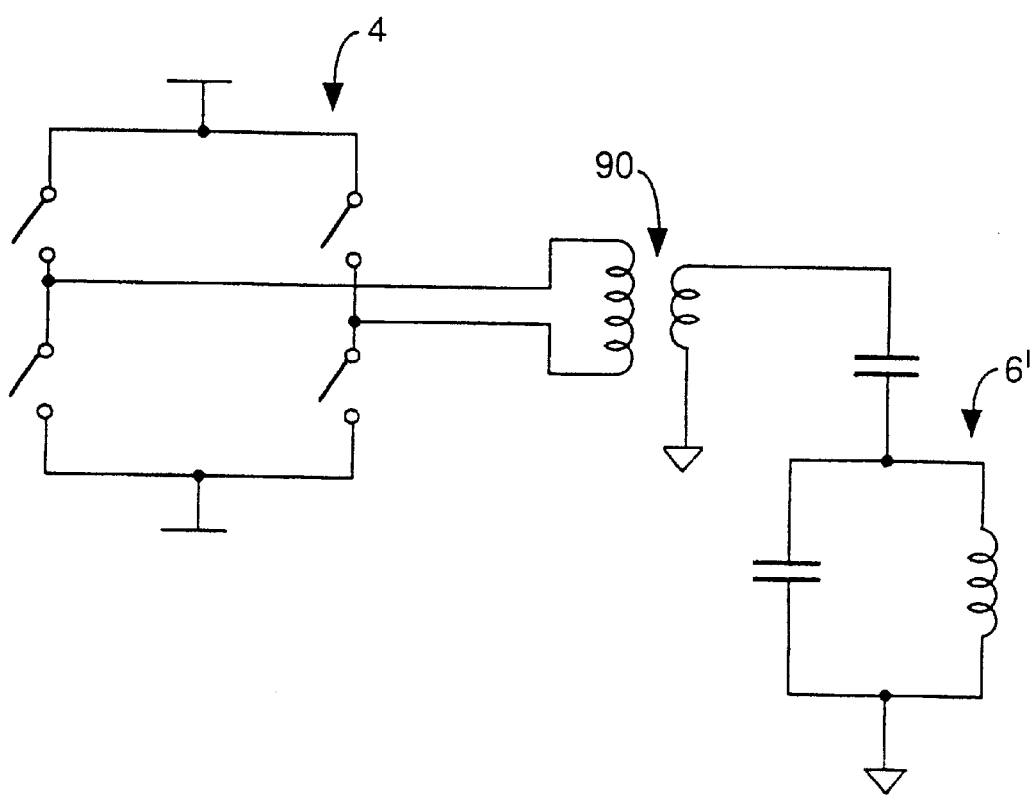
FIG. 9 illustrates an alternative tank circuit topology.

FIG. 9 illustrates an alternative tank circuit topology. In this case the tank circuit comprises a parallel resonant circuit 6' connected via transformer 90 to the H-bridge 4 (which is as previously described).

It is possible to replace the four separate HEXFET modules, and their diodes, with a custom-designed hybrid construction H-bridge solid state bridge (i.e.: the circuit will be the same but all the solid state silicon devices will be fabricated on a ceramic substrate in one large module—this gives improvements in performance, reduces size and eases connection to the tuned circuit).

I claim:

1. An rf magnetic field pulse generator for generating an rf magnetic field pulse for use in an NMR investigation, the generator comprising:

two arms connected in parallel between a pair of input terminals, each arm comprising two serially connected solid-state switches;

a transmitter coil which is part of a tuned resonant circuit and which is connected between output terminals defined between each pair of serially connected solid-state switches respectively, the transmitter coil being adapted to transmit the magnetic field pulse in response to an alternating rf signal at the output terminals;

a power source connected to one or both input terminals; and, control means adapted to alternately operate a respective switch in each arm at a required radio frequency in use whereby the power source is connected with alternating polarity across the transmitter coil and generates an alternating rf signal at the output terminals.

2. A generator according to claim 1, wherein each solid-state switch comprises a MOSFET switching power transistor.

3. A generator according to claim 1, wherein each switch comprises a plurality of solid-state switches in parallel.

4. A generator according to claim 1, wherein the control means comprises a gate drive circuit adapted to input two control signals which are 180° out of phase with each other and drive the gate of a respective switch in each arm.

5. A generator according to claim 1, wherein the resonant circuit comprises a capacitance in parallel or series with the transmitter coil.

6. A generator according to claim 5, wherein the capacitance comprises a plurality of parallel capacitors, each capacitor having a respective switch; and control means adapted to control the capacitor switches to adjust the resonant frequency of the resonant circuit to a desired Lamor frequency of a sample being investigated.

7. A generator according to claim 1, wherein the power source comprises a power storage capacitor.

8. A generator according to claim 1, further comprising an active ring-down circuit comprising one or more damping resistances connected via one or more switches to the transmitter coil, and control means adapted to close the switch(es) after a magnetic pulse whereby the damping resistance(s) form part of a current loop including the transmitter coil and dissipate energy so as to control ring-down in the transmitter coil.

9. A generator according to claim 5, wherein the resonant circuit comprises a capacitance connected serially with the transmitter coil between the output terminals.

10. A down-hole well logging probe comprising: an rf magnetic field pulse generator to generate an rf magnetic field pulse for use in an NMR investigation, the generator including two arms connected in parallel between a pair of input terminals, each arm having two serially connected solid-state switches;

a transmitter coil which is part of a tuned resonant circuit and which is connected between output terminals defined between each pair of serially connected solid-state switches respectively, the transmitter coil being adapted to transmit the magnetic field pulse in response to an alternating rf signal at the output terminals;

a power source connected to one or both input terminals; and, a controller adapted to alternately operate a respective switch in each arm at a required radio frequency in use, whereby the power source is connected with alternating polarity across the transmitter coil and generates an alternating rf signal at the output terminals.

11. A method of operating an rf magnetic field pulse generator to generate an rf magnetic field pulse for use in an NMR investigation, the generator including two arms connected in parallel between a pair of input terminals, each arm comprising two serially connected solid-state switches; a transmitter coil which is part of a tuned resonant circuit and which is connected between output terminals defined between each pair of serially connected solid-state switches respectively, the transmitter coil being adapted to transmit the magnetic field pulse in response to an alternating rf signal at the output terminals; a power source connected to one or both input terminals; and, a controller means adapted to alternately operate a respective switch in each arm at a required radio frequency in use whereby the power source is connected with alternating polarity across the transmitter coil and generates an alternating rf signal at the output terminals, the method comprising:

operating respective ones of each pair of solid-state switches during a pulse; and at the end of the pulse opening all four switches whereby ring-down in the transmitter coil is controlled.

12. A generator according to claim 1, wherein the resonant circuit is connected between the pair of serially connected solid state switches via a transformer.

* * * * *